(12) United States Patent
Kim et al.

(10) Patent No.: US 6,717,848 B2
(45) Date of Patent: Apr. 6, 2004

(54) SENSING CIRCUIT IN A MULTI-LEVEL FLASH MEMORY CELL

(75) Inventors: Ki Seog Kim, Ichon-Shi (KR); Young Seon You, Sungnam-Shi (KR); Won Yeol Choi, Seoul (KR); Yoo Nam Jeon, Ichon-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/287,779

(22) Filed: Nov. 5, 2002

(65) Prior Publication Data

US 2003/0123294 A1 Jul. 3, 2003

(30) Foreign Application Priority Data

Dec. 29, 2001 (KR) ........................................ 2001-87985

(51) Int. Cl.[7] .............................................. G11C 16/04
(52) U.S. Cl. .............................. 365/185.03; 365/185.2; 365/185.21; 365/185.33
(58) Field of Search ......................... 365/185.03, 185.2, 365/185.21, 185.33

(56) References Cited

U.S. PATENT DOCUMENTS

| | | | | |
|---|---|---|---|---|
| 5,485,422 A | * | 1/1996 | Bauer et al. | 365/185.21 |
| 5,646,887 A | * | 7/1997 | Truong et al. | 365/185.21 |
| 5,877,985 A | * | 3/1999 | Banba et al. | 365/185.21 |
| 6,018,477 A | * | 1/2000 | Wang | 365/185.03 |
| 6,222,762 B1 | * | 4/2001 | Guterman et al. | 365/185.03 |

* cited by examiner

Primary Examiner—Trong Phan
(74) Attorney, Agent, or Firm—Jacobson Holman PLLC

(57) ABSTRACT

The present invention relates to a sensing circuit in a multi-level flash memory cell capable of exactly sensing a state of the multi-level flash memory cell by sensing four states of the multi-level flash memory cell based on first through third reference cells. The first reference cell has a threshold voltage by which a program or erase state of a floating gate can be determined in a state that a capacitor of the multi-level flash memory cell is discharged, a second reference cell has a threshold voltage by which a charge or discharge state of the capacitor can be determined with the floating gate of the multi-level flash memory cell being at a discharge state, and a third reference cell has a threshold voltage by which a charge or discharge state of the capacitor can be determined with the floating gate of the multi-level flash memory cell being at a program state.

8 Claims, 2 Drawing Sheets

SENSING CIRCUIT IN A MULTI-LEVEL FLASH MEMORY CELL

BACKGROUND OF THE INVENTION

1. Field of the Invention

The invention relates generally to a sensing circuit in a multi-level flash memory cell. More particularly, the invention relates to a sensing circuit in a multi-level flash memory cell capable of exactly sensing a state of the multi-level flash memory cell by sensing four states of the multi-level flash memory cell based on first through third reference cells, in which the first reference cell has a threshold voltage by which a program or erase state of a floating gate can be determined in a state that a capacitor of the multi-level flash memory cell is discharged, a second reference cell has a threshold voltage by which a charge or discharge state of the capacitor can be determined with the floating gate of the multi-level flash memory cell being at a discharge state, and a third reference cell has a threshold voltage by which a charge or discharge state of the capacitor can be determined with the floating gate of the multi-level flash memory cell being at a program state.

2. Description of the Prior Art

In order to store large amount of information, a multi-level flash memory cell is constructed in which a capacitor using a ferroelectric material as a dielectric film is connected to a source of a flash memory cell. A cross-sectional view of the multi-level flash memory cell is shown in FIG. 1. In FIG. 1. the reference characters $V_S$, $V_D$, and $V_G$ are voltages applied to a source, a drain and a gate of the flash memory cell, respectively, and VB_P and VB_N are charge voltages stored respectively in a P-type well and an N-type well of the capacitor.

A N-well 102 and a P-well 103 are formed on a semiconductor substrate 101. A stack gate structure in which a tunnel oxide film 104, a floating gate 105, a first dielectric film 106 and a control gate 107 are stacked at a given region on the semiconductor substrate 101 is formed. A source 108 and a drain 109 are formed at a given region of the semiconductor substrate 101 by an impurity ion implantation process. A given region of a first interlayer insulating film 110 formed on the entire structure is etched to form a first contact hole through which the source 108 and the drain 109 are exposed. A conductive material is filled up to form a plug 111. A bit line 112 to be connected to the drain 109 and a pad 113 to be connected to the source 108 is formed, on an upper side of the first interlayer insulating film 110. A given region of the second interlayer insulating film 114 formed on the entire structure is etched to form a second contact hole through which the pad 113 is exposed. A lower electrode 115 is formed so that the second contact hole can be buried. A second dielectric film 116 and an upper electrode 117 are formed on the lower electrode 115. At this time, the second dielectric film 116 is made of a ferroelectric material such as PZT, etc. other than common materials so that information can be maintained with supply of the power stopped.

As such, the capacitor is constructed using a ferroelectric material as a dielectric film so that the capacitor can be connected to a source of the flash memory cell. Therefore, information of 2 bits per cell can be stored by combination of whether the floating gate is charged and the capacitor is charged.

Table 1 shows a state of the multi-level flash memory cell depending on a state of the floating gate and whether the capacitor is charged.

In other words, if the floating gate is a program state and the capacitor is charged, the cell has a state of "00". If the floating gate is at a program state and the capacitor is not charged, the cell has a state of "01". Also, if the floating gate is at an erase state and the capacitor is charged, the cell has a state of "10". If the floating gate is at an erase state and the capacitor is not charged, the cell has a state of "11".

TABLE 1

| State of Floating Gate | Capacitor Charged? | Cell State |
| --- | --- | --- |
| Program: "−" | Yes : "0" | "00" |
|  | No : "1" | "01" |
| Erase: "+" | Yes : "0" | "10" |
|  | No : "1" | "11" |

However, it is not clearly defined on how the information store state of the above cell can be determined. Further, there is a problem that the procedure of determining the state is very complicated.

SUMMARY OF THE INVENTION

The present invention is contrived to solve the above problems and an object of the present invention is to provide a sensing circuit in a multi-level flash memory cell capable of exactly determining a state of the multi-level flash memory cell having a flash memory cell and a capacitor connected to a source of the flash memory cell.

In order to accomplish the above object, a sensing circuit in a multi-level flash memory cell according to the present invention, is characterized in that it comprises a multi-level flash memory cell having a flash memory cell and a capacitor connected to a source of the flash memory cell; a first sense amplifier for comparing a state of the multi-level flash memory cell with a first reference cell; a second sense amplifier for comparing a state of the multi-level flash memory cell with a second reference cell; a third sense amplifier for comparing a state of the multi-level flash memory cell with a third reference cell; a logical means for logically combining a sensing enable signal and an output signal of the first sense amplifier; first and second switching means for supplying the power supply voltage, respectively, depending on an output signal of the logical means and its inverted signal; a third switching means for connecting the second reference cell and the multi-level flash memory cell to the second sense amplifier, depending on the power supply voltage supplied by the first switching means; and a fourth switching means for connecting the third reference cell and the multi-level flash memory cell to the third sense amplifier, depending on the power supply voltage supplied by the second switching means.

Meanwhile, a first reference cell has a threshold voltage by which a program or erase state of a floating gate can be determined in a state that a capacitor of the multi-level flash memory cell having a source connected to a capacitor and a flash memory cell are discharged, a second reference cell has a threshold voltage by which a charge or discharge state of the capacitor can be determined with the floating gate of the multi-level flash memory cell being at a discharge state, and a third reference cell has a threshold voltage by which a charge or discharge,state of the capacitor can be determined with the floating gate of the multi-level flash memory cell being at a program state.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
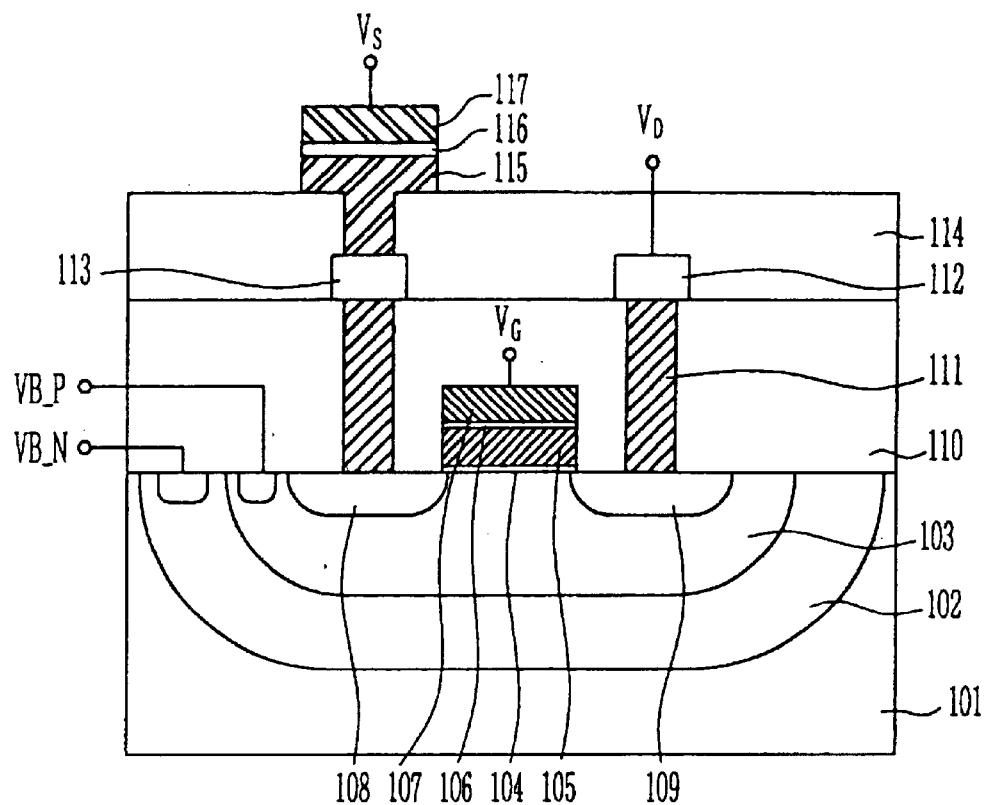
FIG. 1 is a cross-section view of a multi-level cell having a flash memory cell and a capacitor.

The present invention will be described in detail by way of a preferred embodiment with reference to accompanying drawings, in which like reference numerals are used to identify the same or similar parts.

Figure 2:
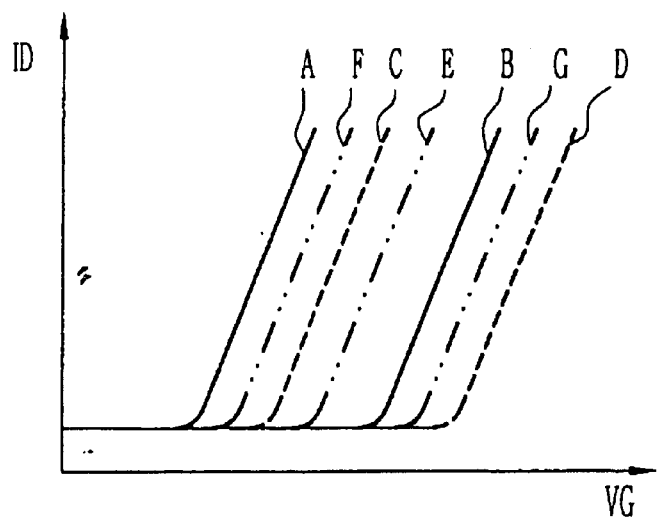
FIG. 2 shows a graph illustrating characteristics of a threshold voltage depending on a state of a multi-level flash memory cell and a threshold voltage of a flash memory cell applied to a sensing circuit according to the present invention.

FIG. 2 shows a graph illustrating characteristics of a threshold voltage depending on a state of a multi-level flash memory cell and a threshold voltage of a flash memory cell applied to a sensing circuit according to the present invention. In FIG. 2, the reference character ID is a current applied to a drain of the flash memory cell, and the reference character VG is the threshold voltage of the flash memory cell.

As shown, a cell with the capacitor having a discharge state and the floating gate having an erase state, has a characteristic curve such as "A". A cell with the capacitor having a discharge state and the floating gate having a program state, has a characteristic curve such as "B". In other words, the cell having a characteristic curve of "A" has a state of "11" since the floating gate is at an erase state and the capacitor is at a discharge state. The cell having a characteristic curve of "B" has a state of "01" since the floating gate is at a program state and the capacitor is at a discharge state. In the above state, if electric charges are charged into the capacitor, the "A" curve will move to "C" and the "B" curve will move to "D".

In other words, the cell having a characteristic curve of "C" has a state of "10" since the floating gate is at a program state and the capacitor is at a charge state. The cell having a characteristic curve of "D" has a state of "00" since the floating gate is at a program state and the capacitor is at a charge state. The characteristic curves of "A" through "D" are curves of a common flash memory cell in which an erase and program state of the floating gate and a given voltage is applied to a source with the above state. In each of the curves, the gate voltage has 1V in case of "A", 3V in case of "B", 5V in case of "C" and 7V in case of "D", for ease of explanation.

Cells that threshold voltage of which is controlled to have a medium characteristic curve between the above characteristic curves are positioned. In other words, a cell having a characteristic of a curve "E" between the curves "C" and "B" is positioned, a cell having a characteristic of a curve "F" between the curves "A" and "C" is positioned, and a cell having a characteristic of a curve "G" between the curves "B" and "D" is positioned.

Therefore, the cell having the characteristic of the curve "E" has a threshold voltage between a characteristic curve in which the floating gate is at an erase state and the capacitor is at a charge state and a characteristic curve in which the floating gate is at a program state and the capacitor is at a discharge state, for example 4V. Also, the cell having the characteristic of the curve "F" has a threshold voltage between a characteristic curve in which the floating gate is at an erase state and the capacitor is at a discharge state and a characteristic curve in which the floating gate is at an erase state and the capacitor is at a charge state, for example 2V. Further, the cell having the characteristic of the curve "G" has a threshold voltage between a characteristic curve in which the floating gate is at a program state and the capacitor is at a discharge state and a characteristic curve in which the floating gate is at a program state and the capacitor is at a charge state, for example 6V.

It is recommended that the threshold voltages of the cells having the characteristic curves of "E", "F" and "G" be controlled considering a back bias as much as the charge voltage VB of the capacitor.

Figure 3:
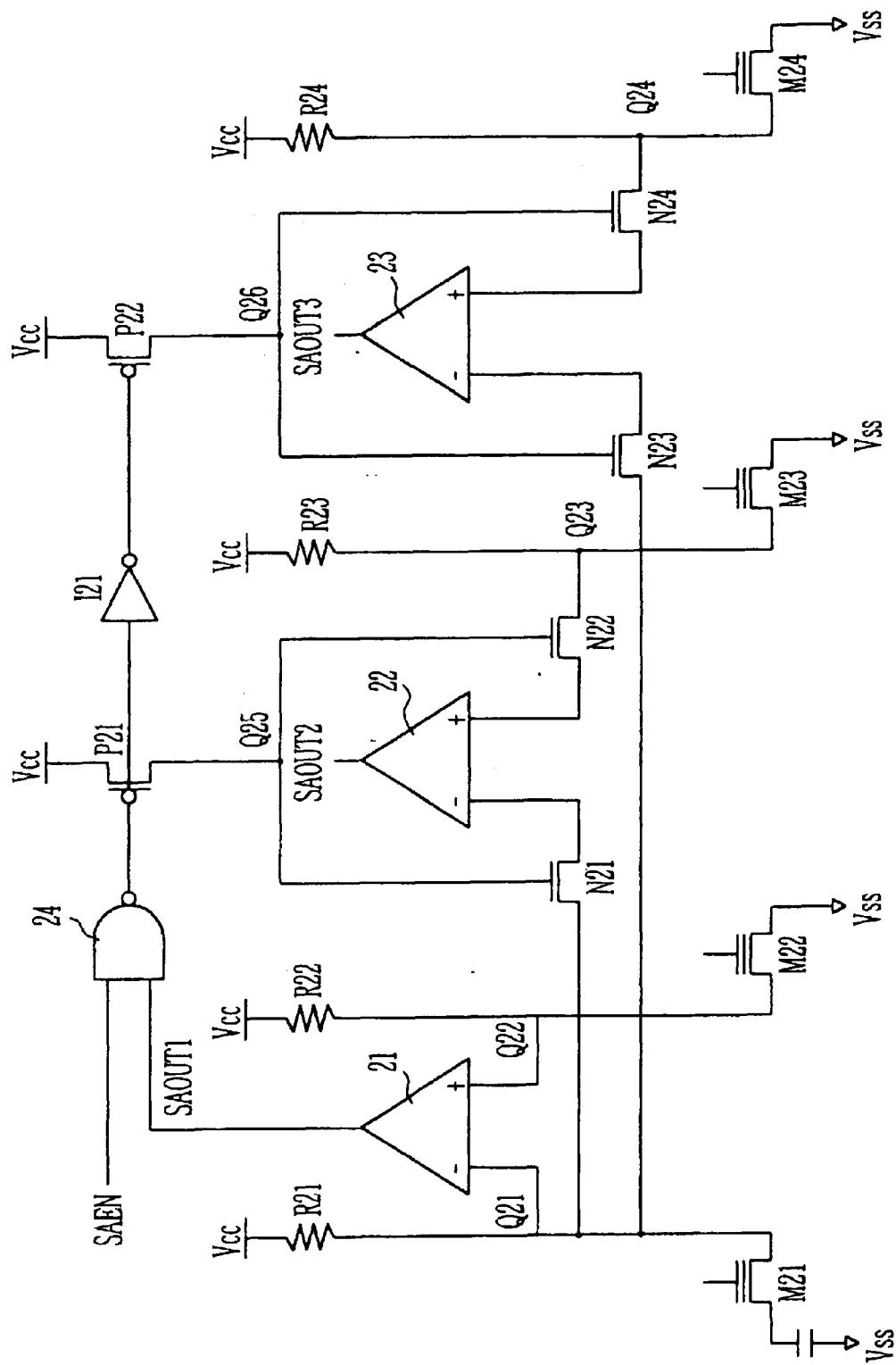
FIG. 3 shows a sensing circuit for sensing a stat of a multi-level flash memory cell having a flash memory cell and a capacitor connected to a source of the flash memory cell according to the present invention.

Referring now to FIG. 3, a construction of a sensing circuit in a multi-level flash memory cell according to the present invention will be described.

In order to sense a state of the multi-level flash memory cell according to the present invention, cells having the characteristic curves of "E", "F" and "G" shown in FIG. 2 is used as reference cells. In other words, in order to sense four states of the multi-level flash memory cell, it is required three types of the reference cells: the first reference cell for determining a program or erase state of the floating gate with the capacitor of the multi-level flash memory cell being at a discharge state, the second reference cell for determining a charge or discharge state of the capacitor with the floating gate being at an erase state, and the third reference cell for determining a charge or discharge state of the capacitor with the floating gate being at a program state. At this time, the first reference cell is constructed using the cell having the characteristic curve of "E" in FIG. 2, the second reference cell is constructed using the cell having the characteristic curve of "F" in FIG. 2 and the third reference cell is constructed using the cell having the characteristic curve of "G" in FIG. 2.

A first resistor R21 is connected between the power supply Vcc and a first node Q21. A main multi-level flash memory cell M21 having a flash memory cell and a capacitor connected to a source of the flash memory cell is connected between the first node Q21 and the ground Vss. A second resistor R22 is connected between the power supply Vcc and a second node Q22. A first reference cell M22 is connected between the second node Q22 and the ground Vss. A third resistor R23 is connected between the power supply Vcc and a third node Q23. A second reference cell M23 is connected between the third node Q23 and the ground Vss. A fourth resistor R24 is connected between the power supply Vcc and a fourth node Q24. A third reference cell M24 is connected between the fourth node Q24 and the ground Vss.

At this time, the first reference cell M22 is constructed using a cell the threshold voltage of which is controlled to have the characteristic curve of "E" in FIG. 2, by which a program or erase state of the floating gate can be determined with the capacitor of the multi-level flash memory cell being at a discharge state. Also, the second reference cell M23 is constructed using a cell the threshold voltage of which is controlled to have the characteristic curve of "F" in FIG. 2, by which a charge or discharge state of the capacitor can be determined with the floating gate of the multi-level flash memory cell being at an erase state. In addition, the third reference cell M24 is constructed using a cell the threshold voltage of which is controlled to have the characteristic curve of "G" in FIG. 2, by which a charge or discharge state of the capacitor can be determined with the floating gate of the multi-level flash memory cell being at a program state.

A first sense amplifier 21 compares the potential of the first node Q21 depending on a state of the multi-level flash memory cell M21 and the potential of the second node Q22 depending on the first reference cell M22. A NAND gate 24 logically combines a sensing enable signal SAEN and an output signal of the first sense amplifier 21 to output the result. A first PMOS transistor P21 connected between the power supply Vcc and a fifth node Q25 is driven by an output signal of the NAND gate 24. A second PMOS transistor P22 connected between the power supply Vcc and a sixth node Q26 is driven by a signal in which an output signal of the NAND gate 24 is inverted through an inverter 121. A first NMOS transistor N21 connected between the first node Q21 and the second sense amplifier 22, and a second NMOS transistor N22 connected between the third node Q23 and the second sense amplifier 22 are driven depending on the potential of the fifth node Q25. Also, a third NMOS transistor N23 connected between the first node Q21 and a third sense amplifier 23, and a fourth NMOS transistor N24 connected between the fourth node Q24 and the third sense amplifier 23 are driven depending on the potential of the sixth node Q26. The second sense amplifier 22 compares the potential of the first node Q21 depending on a state of the multi-level flash memory cell M21 through the first NMOS transistor N21, and the potential of the third node Q23 depending on the second reference cell M23 through the second NMOS transistor N22. The third sense amplifier 23 compares the potential of the first node Q21 depending on a state of the multi-level flash memory cell M21 through the third NMOS transistor N23, and the potential of the fourth node Q24 depending on the third reference cell M24 through the fourth NMOS transistor N24.

A method of driving the sensing circuit in the multi-level flash memory cell constructed above according to the present invention will be below described.

In order to sense the multi-level flash memory cell M21, if the sensing enable signal SAEN is applied with a HIGH state, the first sense amplifier 21 compares the potential of the first node Q21 depending on a state of the multi-level flash memory cell M21 and the potential of the second node Q22 depending on a state of the first reference cell M22 to output the comparison result. As a result of the comparison, if the potential of the first node Q21 is higher than that of the second node Q22, the first sense amplifier 21 determines that the multi-level flash memory cell M21 is at a program state. Thus, the first sense amplifier 21 outputs a signal of a LOW state SAOUT1. However, if the potential of the first node Q21 is lower than that of the second node Q22, the first sense amplifier 21 determines that the multi-level flash memory cell M21 is at an erase state. Therefore, the first sense amplifier 21 outputs a signal of a HIGH state SAOUT1.

The output signal SAOUT1 of the first sense amplifier 21 is inputted to the NAND gate 24 along with the sensing enable signal SAEN of a HIGH state. In other words, if the output signal SAOUT of the first sense amplifier 21 is outputted with a LOW state since it is determined that the multi-level flash memory cell M21 is at a program state, the NAND gate 24 outputs a signal of a HIGH state. On the contrary, if the output signal SAOUT of the first sense amplifier 21 is outputted with a HIGH state since it is determined that the multi-level flash memory cell M21 is at an erase state, the NAND gate 24 outputs a signal of a LOW state.

If an output signal of the NAND gate 22 is at a LOW state since the multi-level flash memory cell M21 is at an erase state, the first PMOS transistor P21 is turned on. The signal is then inverted by the first inverter 121, so that the second PMOS transistor P22 is turned off. Thus, the power supply voltage Vcc is supplied to the fifth node Q25 through the turned-on first PMOS transistor P21. Thereby, the first and second NMOS transistors N21 and N22 are turned on. Due to this, the second sense amplifier 22 compares the potential of the first node Q21 depending on a state of the multi-level flash memory cell M21 and the potential of the third node Q23 depending on the second reference cell M23 to output the comparison result. In other words, in case that the output signal SAOUT2 of the second sense amplifier 22 is at a HIGH state, the multi-level flash memory cell M21 determines that the floating gate is at an erase state and the capacitor is at a discharge state. In a case that the output signal SAOUT2 of the second sense amplifier 22 is at a LOW state, the multi-level flash memory cell M21 determines that the floating gate is at an erase state and the capacitor is at a charge state.

With the multi-level flash memory cell M21 being at a program state, if an output signal of the NAND gate 24 is at a HIGH state, the first PMOS transistor P21 is turned off. The signal is then inverted to be a LOW state by the first inverter 121, so that the second PMOS transistor P22 is turned on. The power supply voltage Vcc is thus supplied to the sixth node Q26 through the turned-on second PMOS transistor P22. Thus, the third and fourth NMOS transistors N23 and N24 are turned on. Due to this, the third sense amplifier 23 compares the potential of the first node Q21 depending on a state of the multi-level flash memory cell M21 and the potential of the fourth node Q24 depending on the third reference cell M24 to output a comparison result. In other words, in case that the output signal SAOUT3 of the third sense amplifier 23 is at a HIGH state, the multi-level flash memory cell M21 determines that the floating gate is at a program state and the capacitor is at a discharged state. In case that the output signal SAOUT3 of the third sense amplifier 23 is at a LOW state, the multi-level flash memory cell M21 determines that the floating gate is a program state and the capacitor is a charged state.

At this time, a delay means may be connected to the second node Q22 connected to the first reference cell M22 in order to isolate the multi-level flash memory cell M21 using a given delay time.

As mentioned above, according to the present invention, a first reference cell has a threshold voltage by which a program or erase state of a floating gate can be determined in a state that a capacitor of the multi-level flash memory cell is discharged, a second reference cell has a threshold voltage by which a charge or discharge state of the capacitor can be determined with the floating gate of the multi-level flash memory cell being at a discharge state, and a third reference cell has a threshold voltage by which a charge or discharge state of the capacitor can be determined with the floating gate of the multi-level flash memory cell being at a program state.

Therefore, the present invention has an advantage that a state of the multi-level flash memory cell can be exactly sensed by sensing four states of the multi-level flash memory cell based on the first through third reference cells.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A sensing circuit in a multi-level flash memory cell, comprising:
   a multi-level flash memory cell having a flash memory cell and a capacitor connected to a source of the flash memory cell;
   a first sense amplifier for comparing a state of said multi-level flash memory cell with a first reference cell;
   a second sense amplifier for comparing a state of said multi-level flash memory cell with a second reference cell;
   a third sense amplifier for comparing a state of said multi-level flash memory cell with a third reference cell;
   a logical means for logically combining a sensing enable signal and an output signal of said first sense amplifier;
   first and second switching means for supplying the power supply voltage, respectively, depending on an output signal of said logical means and its inverted signal;
   a third switching means for connecting said second reference cell and said multi-level flash memory cell to said second sense amplifier, depending on the power supply voltage supplied by said first switching means; and
   a fourth switching means for connecting said third reference cell and said multi-level flash memory cell to said third sense amplifier, depending on the power supply voltage supplied by said second switching means.

2. The sensing circuit as claimed in claim 1, wherein said first reference cell has a threshold voltage by which a program or erase state of a floating gate can be determined with the capacitor of said multi-level flash memory cell being a discharge state.

3. The sensing circuit as claimed in claim 1, wherein said second reference cell has a threshold voltage by which a charge or discharge state of the capacitor can be determined with the floating gate of said multi-level flash memory cell being an erase state.

4. The sensing circuit as claimed in claim 1, wherein said third reference cell has a threshold voltage by which a charge or discharge state of the capacitor can be determined with the floating gate of said multi-level flash memory cell being a program state.

5. The sensing circuit as claimed in claim 1, wherein said logical means is a NAND gate.

6. The sensing circuit as claimed in claim 1, wherein each of said first and second switching means is a PMOS transistor.

7. The sensing circuit as claimed in claim 1, wherein said third switching means includes:
   a first NMOS transistor for connecting said multi-level flash memory cell and said second sense amplifier; and
   a second NMOS transistor for connecting said second reference cell and said second sense amplifier.

8. The sensing circuit as claimed in claim 1, wherein said fourth switching means includes:
   a first NMOS transistor for connecting said multi-level flash memory cell and said third sense amplifier; and
   a second NMOS transistor for connecting said third reference cell and said third sense amplifier.

* * * * *